(12) United States Patent
Jin et al.

(10) Patent No.: US 9,741,391 B1
(45) Date of Patent: Aug. 22, 2017

(54) ON THE FLY FORMATTING

(71) Applicant: Seagate Technology LLC, Cupertino, CA (US)

(72) Inventors: Heungtae Jin, Seoul-si (KR); Mansik Shim, Gyeonggi-do (KR); Mingyeong Son, Seoul (KR); Eunyeong Hong, Seoul (KR)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/168,209

(22) Filed: May 30, 2016

Related U.S. Application Data

(63) Continuation of application No. 14/611,120, filed on Jan. 30, 2015, now Pat. No. 9,355,680.

(51) Int. Cl.
| | | |
|---|---|---|
| *G11B 5/09* | (2006.01) | |
| *G11B 20/18* | (2006.01) | |
| *G11B 20/12* | (2006.01) | |
| *G06F 11/10* | (2006.01) | |
| *H03M 13/29* | (2006.01) | |
| *H03M 13/11* | (2006.01) | |

(52) U.S. Cl.
CPC ...... *G11B 20/1833* (2013.01); *G06F 11/1076* (2013.01); *G11B 20/1217* (2013.01); *H03M 13/1102* (2013.01); *H03M 13/2906* (2013.01); *G11B 2020/1232* (2013.01); *G11B 2020/1242* (2013.01); *G11B 2020/185* (2013.01)

(58) Field of Classification Search
CPC ........... G11B 5/012; G11B 27/36; G11B 5/02; G11B 2220/20; G11B 5/09; G11B 20/1426; G11B 2220/90; G11B 20/1217; G11B 20/1833; G11B 2020/1232; G11B 5/6005; G11B 5/59633; G11B 15/87
USPC ....... 360/25, 31, 40, 48, 53, 75, 46, 110, 69, 360/27
See application file for complete search history.

(56) References Cited

U.S. PATENT DOCUMENTS

| | | | |
|---|---|---|---|
| 2006/0018051 A9* | 1/2006 | Chiao | G11B 5/012 360/31 |
| 2011/0066768 A1* | 3/2011 | Brittner | H04L 1/0001 710/18 |
| 2014/0055881 A1* | 2/2014 | Zaharris | G11B 5/012 360/55 |

* cited by examiner

*Primary Examiner* — Nabil Hindi
(74) *Attorney, Agent, or Firm* — Cesari & Reed, LLP; Kirk A. Cesari; Christian W. Best

(57) ABSTRACT

The disclosure is related to systems and methods of On the Fly Formatting. Various parameters that influence areal density of hard disc regions can be changed on the fly based on storage capacity and reliability needs. Further adjustments can be made to the formatting of the region to fine tune achievable storage capacity and reliability values. In some cases, the formatting can include error correction code strength, gap widths between user data sectors and servo data sectors, other characteristics or parameters, or any combinations thereof.

20 Claims, 8 Drawing Sheets

ON THE FLY FORMATTING

CROSS-REFERENCE TO RELATED APPLICATION

The present application is a continuation of and claims priority to U.S. patent application Ser. No. 14/611,120 filed on Jan. 30, 2015, entitled "ON THE FLY FORMATTING", the contents of which is hereby incorporated by reference in its entirety.

SUMMARY

In some embodiments, a data storage device can include a magnetic data storage medium, and a circuit configured to modify, in real-time, an areal density of a region of the magnetic data storage medium based on one or more characteristics of the data storage device.

In some embodiments, a method can include formatting a region of the magnetic data storage medium based on one or more characteristics of the data storage device.

In some embodiments, an apparatus can include a circuit configured to modify, in real-time, an areal density of a region of a magnetic data storage medium based on a reliability value.

DETAILED DESCRIPTION

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor, controller, or a data storage device, such as hard disc drive or hybrid drive. Dedicated hardware implementations including, but not limited to, application specific integrated circuits, programmable logic arrays, and other hardware devices can likewise be constructed to implement the methods and functions described herein. Further, the methods and functions described herein may be implemented as a device, such as a computer readable storage medium or memory device, including instructions that when executed cause a processor to perform the methods.

Areal densities of hard disc regions can be changed based on storage capacity and reliability needs. Further adjustments can be made to the formatting of the region to fine tune achievable storage capacity and reliability values. In some cases, the formatting can include error correction code strength, gap widths between the region and servo data sectors, or other characteristics.

Examples are provided herein illustrating a system for on the fly formatting for adjusting the storage capacity and reliability of a region by modifying the areal density, error correcting code (ECC), or other characteristics of the region.

Figure 1:
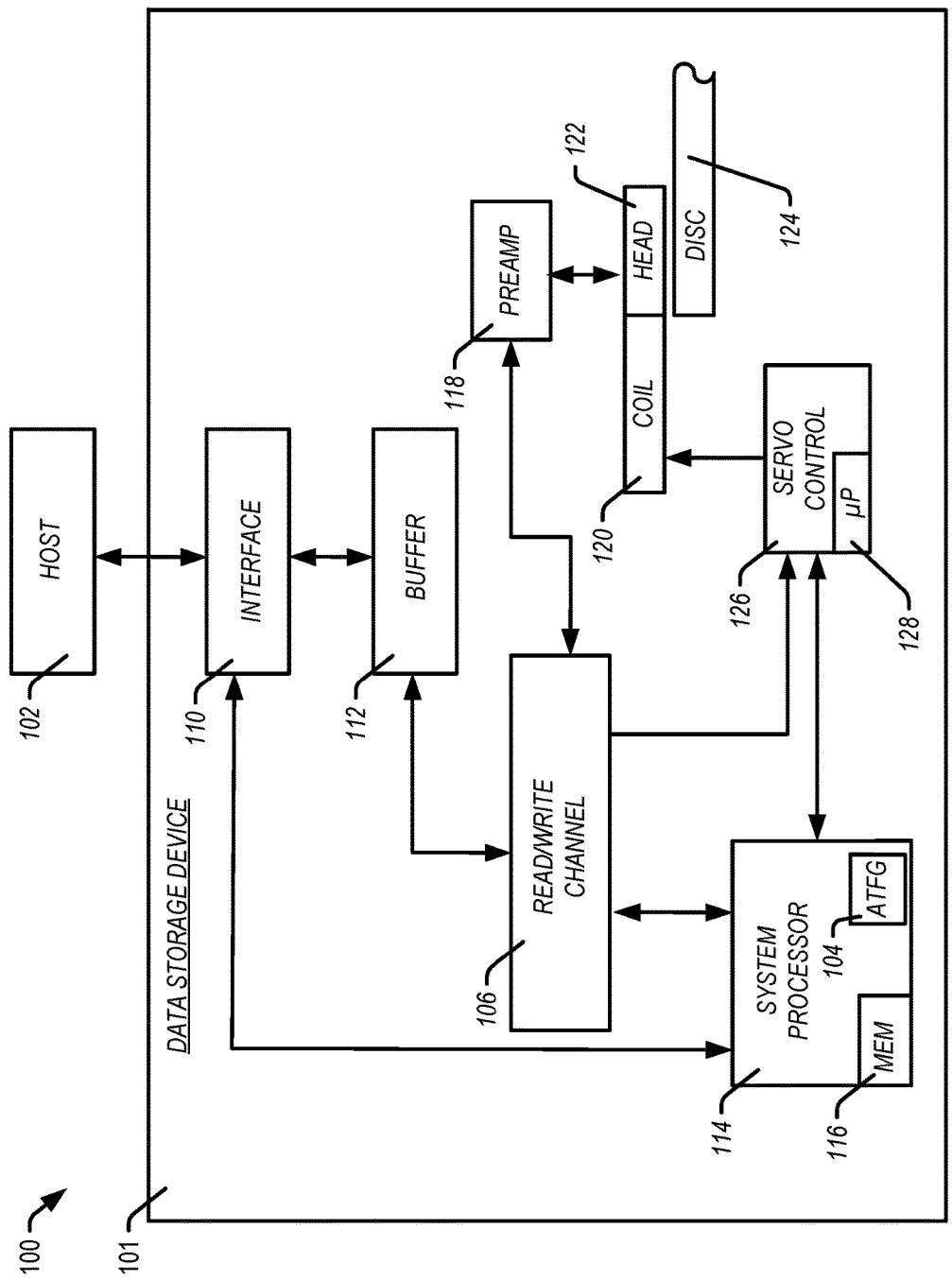
FIG. 1 is a diagram of a system of On the Fly Formatting, in accordance with certain embodiments of the present disclosure.

Referring to FIG. 1, certain embodiments of a system for on the fly formatting are shown and generally designated 100. Data storage device ("DSD") 101 can optionally connect to be removable from a host device 101, which can be a desktop computer, a laptop computer, a server, a telephone, a music player, another electronic device, or any combination thereof. The DSD 101 can communicate with the host device 102 via the hardware/firmware based host interface circuit 110 that may include a connector that allows the DSD 101 to be physically removed from the host 102.

The DSD 101 can include a system processor 114 and associated memory 116. The system processor 114 may be part of a system on chip (SOC). A buffer 112 can temporarily store data during read and write operations. A preamplifier/driver circuit ("preamp") 118 can apply write currents to the head(s) 122 and can provide pre-amplification of read signals. A servo control circuit 126 may use servo data from a servo sector to provide the appropriate current to the voice coil motor 120 to position the head(s) 122 over disc(s) 124. In some cases, the head(s) 122 may have multiple reader elements. The controller 106 can communicate with a processor 114 to move the head(s) 122 to the desired locations on the disc(s) 124 during execution of various pending commands or during other operations. Also, the DSD 101 can include a read/write (R/W) channel 106 which can encode data during write operations and reconstruct user data during read operations.

The DSD 101 can include an adaptive track format generator ("ATFG") 104. The ATFG 104 may be executable firmware that, when executed by the system processor 114, cause the R/W channel 106 to change a format of a region of the disc 108 based on the region's characteristics to achieve storage capacity and reliability specifications. The characteristics can include bits per inch ("BPI"), error correcting code ("ECC") strength, gap width between regions ("ISG"), and other characteristics (see FIGS. 2 and 3). In some cases, the ECC may be low density parity check code ("LDPC"), turbo codes, convolution codes, or other error correcting codes. Changing ECC strength may change the number of bits that need to be stored, which may allow for less space or more space to be allotted to storing ECC. In some cases, the ATFG 104 can change the format of the region during a manufacturing process.

Figure 2:
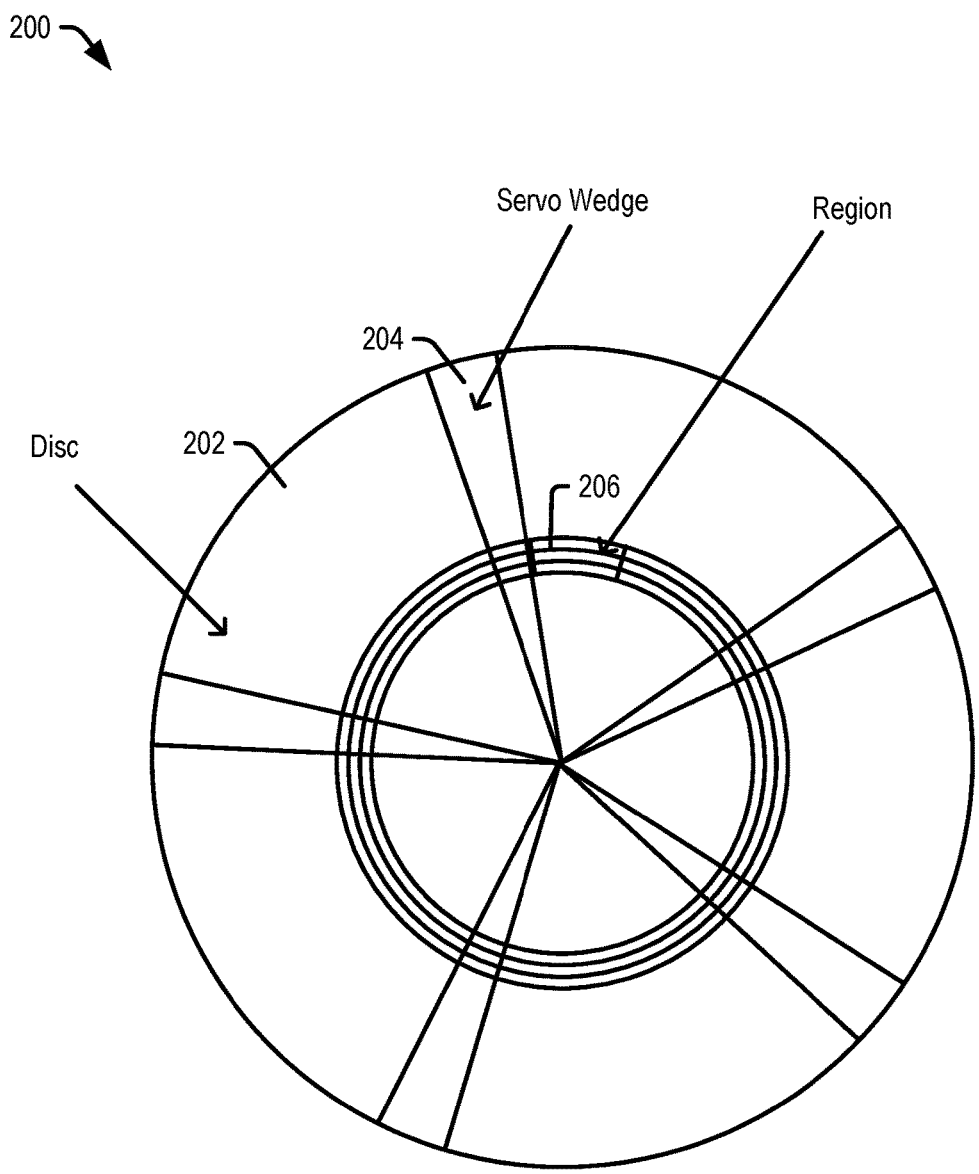
FIG. 2 is a diagram of a system of On the Fly Formatting, in accordance with certain embodiments of the present disclosure.

Referring to FIG. 2, certain embodiments of a system for on the fly formatting are shown and generally designated 200. System 200 is an example of system 100, in accordance with certain embodiments. System 200 can have a disc storage medium 202, which can include a servo wedge 204, and a region 206. The servo wedge 204 can include information that may be used to determine a rotational position of the disc 202. In some cases, there may be multiple servo wedges on the disc medium 202. In some instances, there can be gaps between the servo wedge 204 the region 206.

The region 206 may be a sector, track, zone, or other portion of the disc. The region 206 can include one or more tracks, and may be shingled, non-shingled, bit patterned media, or other storage technology. The disc 202 can have multiple regions, and each region can be a different size and format. In some cases, the size and format of the regions can be changed during manufacturing. For example, the format of the regions may be changed during the manufacture of the disc drive after the components of the disc drive have been assembled. In some examples, the format of the regions may be changed when the discs are manufactured, calibrated, or tested before the disc drive is assembled, or at other times. In some cases, the regions may be formatted during a burn-in test (i.e. components of the disc drive are exercised prior to being placed in service).

During operation, the ATFG can format the region 206 by changing the areal density or other characteristics of the region 206. In some cases, the ATFG may format the region 206 when the storage capacity and reliability of the region 206 are not being met. In some examples, reliability may be a measure of a likelihood of a bit error during storage or transmission. A level of reliability may be determined by measure a bit error rate ("BER"), adjacent track interference ("ATI") margin, other parameters, or any combination thereof. In some cases, reliability may be affected by other characteristics of a DSD. For example, reliability may be reduced due to flaws in a recording head (e.g. too small or too big), scratches or defects on the disc storage medium 202, and so forth.

Figure 3:
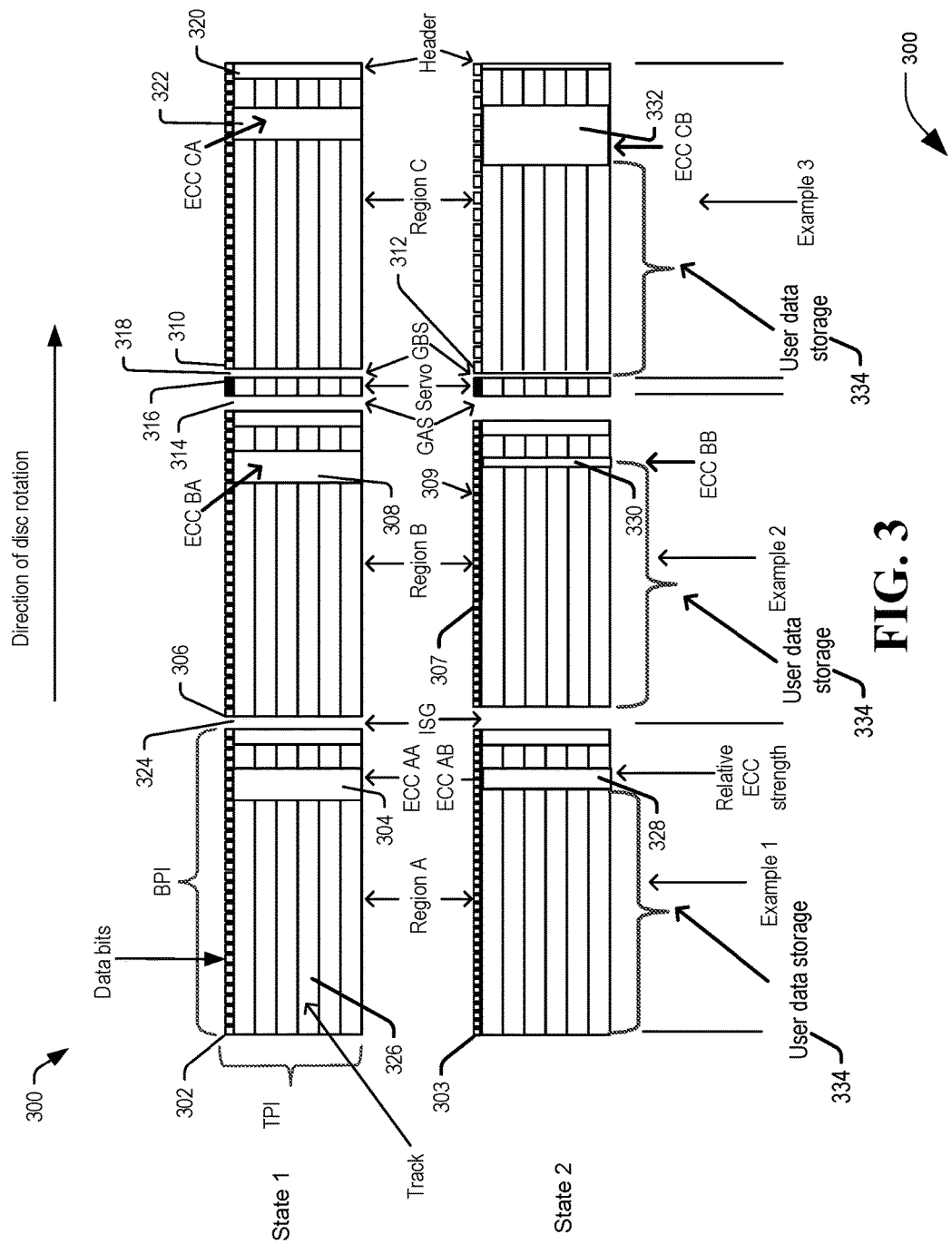
FIG. 3 is a diagram of a system of On the Fly Formatting, in accordance with certain embodiments of the present disclosure.

Referring to FIG. 3, certain embodiments of a system for on the fly formatting are shown and generally designated 300. The embodiments 300 are examples of systems 100 and 200, in accordance with certain embodiments. The embodiments 300 show sample regions A, B, and C, intersector gap (ISG) 324, gap after servo (GAS) 314, servo sector 316, and gap before servo (GBS) 318. The ISG 324, GAS 314, and GBS 318 may be unused storage space. Also shown are region A in a first state 302 and a second state 303, region B in a first state 306 and a second state 307, and region C in a first state 310 and a second state 312. Each region can have data bits 309, tracks 326, user data storage 334, and header 320. In some cases, the user data storage 334 is an amount of a region's total capacity designated to store user data.

Each region may have separate ECC corresponding to data in that region. For illustrative purposes, the ECC strength of each region is shown relative to the ECC strength of other regions. For example, ECC AA 304 can represent an ECC strength of the region A in the first state 302, ECC BA 308 can represent an ECC strength of the region B in the first state 306, and ECC CA 322 can represent an ECC strength of the region C in the first state 310. Further, ECC AB 328 can represent an ECC strength of the region A in the second state 303, ECC BB 330 can represent an ECC strength of the region B in the second state 307, and ECC CB 332 can represent an ECC strength of the region C in the second state 312. ECC AA 304 through ECC CB 332 are not intended to represent absolute values, or any type, size or location of ECC in the regions A, B, and C.

In some embodiments, region A, region B, and region C, may be multiple sectors and multiple tracks, showing one sector of each adjacent track. In some cases, region A, region B, and region C may be the same size, although in other embodiments, region A, region B, and region C may be different storage types, and can be different sizes. For example, region A 302 may be a zone, region B may be a 512 KB sector, and region C may be a 1024 KB sector. Thus, the regions depicted in FIG. 3 are just a subset of storage area that is shown merely to provide an example of factors that can be adjusted to accommodate on the fly formatting to change areal density.

Each region may have a predetermined or initial amount of storage space. Storage space may be configured to store user data, ECC data, header data, preambles, post-ambles, other data, or any combination thereof.

In some cases, the amount of storage space in a region can be adjusted by changing ISG, GAS, GBS, other parameters, or any combination thereof. When the ISG, GAS, or GBS are increased, the storage space of the region may decrease because less physical space is available for the region. In some examples, the amount storage space may increase when the ISG, GAS, or GBS are decreased because more physical space on the disc is available for storing host or user data in the region.

Three examples are shown illustrating how adjustments made to regions in a first state can change parameters in a second state. Referring to example 1, region A state 1 302 and region A state 2 303 are shown. In this example, the ATFG can increase the BPI of region A, and decrease the relative size of the ECC AA 304 to ECC AB 328. Thus, the storage capacity of the region A may be increased and the error correction strength may be decreased.

Referring to example 2, region B state A 306 and region B state B 307 are shown. In this example, the ATFG can increase the BPI of region B, and decrease the relative size of the ECC BA 308 to the ECC BB 330. This can cause an increase in storage capacity but a reduction in error correction strength.

In some cases, changes to the storage capacity and error correction strength may reduce the reliability below an acceptable level. For example, it may be determined that the changes to BPI of a region may increase storage capacity, but may reduce reliability below an acceptable level. In some cases, changing gap parameters (e.g. ISG, GBS, GAS) may be changed to increase reliability by making a data storage device more robust to delay and jitter. The gap parameters may be changed by formatting the region to allow more or less data to be stored in the gap widths. Since data storage takes up physical space, increasing a storage capacity of a user/host data area may reduce a size of one or more gaps. Conversely, reducing a storage capacity of a user/host data area may allow a width of a physical gap to increase, thus increasing ISG 306 and GAS 314 may increase the reliability of region B. In some cases, drive performance can increase as the size of the gaps is increased.

In some embodiments, the ATFG may change a pre-amble length to improve reliability by decreasing the BPI of the preamble. The pre-amble may be a portion of a region used to lock timing to read data (e.g. timing acquisition to seek sync (address) mark). If a defect occurs on the pre-amble portion of a region, remaining valid pre-amble data may be used to lock the timing to read data. The longer the remaining pre-amble length is, the more likely the read data may be read successfully.

Referring to example 3, a case in which BPI is decreased and error correction strength is increased is shown. In some situations, it may be desirable to increase reliability if a region's BER (sometimes referred to as a signal to noise ratio) or ATI exceed threshold levels. The BER is how many erroneous bits occur in a set number of processed or transferred bits. Bit errors may be due to hardware errors, data channel errors, firmware or software errors, processing errors, or other errors. ATI can occur when adjacent tracks are too close; writing data to one track can corrupt data in an adjacent track. Further, when the ATI is above a threshold level, a hard disc may not have enough pitch margin to resist against external shocks or vibrations.

In this example, the ATFG may determine that the reliability of region C at state A 310 may be too low. The ATFG can reduce the BPI, and increase a corrective power of ECC CA 322 to ECC CB 332. In some cases, the corrective power of ECC can be strengthened by allowing more parity bits to be used by the ECC. ECCs using more parity bits may consume more storage resources than ECC using fewer parity bits. Further, the ATFG may reduce a size of the header 320 and increase the GBS 318 to fine tune the parameters to reach a desired outcome. The size of the header 320 may be increased or decreased by changing a number of header parity bits. The GBS 318 may be increased by reducing the overall storage capacity of region C. In some cases, the GBS 318 may be increased or decreased by changing the amount of physical space that the GBS 318 occupies. In some cases, a reduction of storage capacity space on the data storage medium due to the GBS 318 being increased may be mitigated by adjusting other parameters, such as ECC 332, ISG (if applicable), or other parameters, to allow a system to have similar or greater overall storage capacity.

In some cases, the some of the parameters may be individually adjusted. In some embodiments, some of the parameters may be included in a format set. A format set can include a pre-determined combination of parameter values. For example, format set "A" may have ECC=X, ISG=Y, header=Z, format set "B" may have ECC=X', ISG=Y', header=Z', and format set "C" may have ECC=X, ISG=Y', and header=Q". In some examples, the format set may be included in a look-up table, or included in firmware.

In some embodiments, the format of one or more regions may be changed on the fly when the disc drive is outside of a factory environment, or is in service. For example, the format of one or more regions may be changed during operation of the disc drive in a user environment (or non-Original Equipment Manufacturer "OEM" environment).

It should be understood that the examples shown are but a few possible configurations, and many other configurations exist and are too numerous to show in their entireties.

Figure 4:
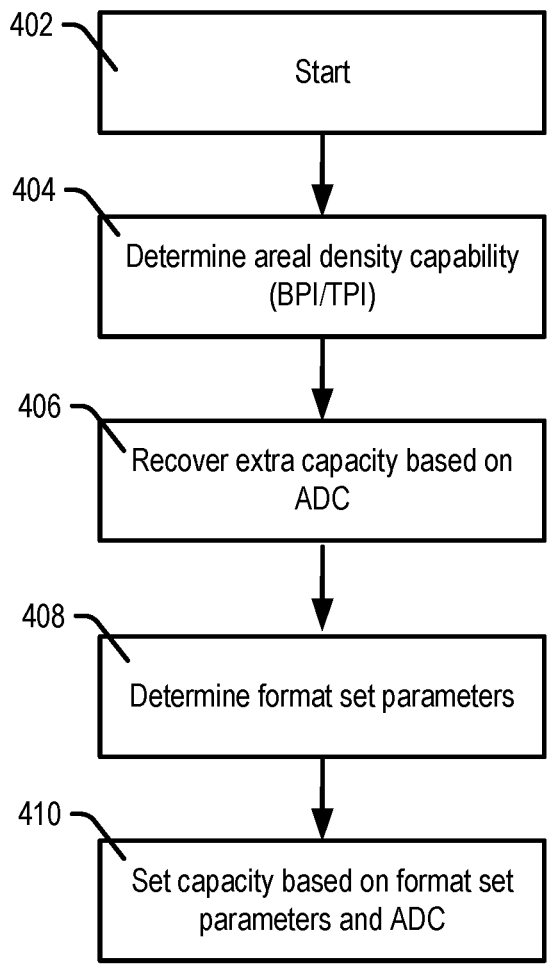
FIG. 4 is a flowchart of a method for On the Fly Formatting, in accordance with certain embodiments of the present disclosure.

Referring to FIG. 4, a flowchart of a method for on the fly formatting is shown and generally designated 400. The method 400 is an implementation of systems 100, 200, or 300, in accordance with certain embodiments.

The method 400 can start at 402. In some embodiments, the method 400 may start during a manufacturing process, such as a burn-in process. The method 400 can determine the areal density capability ("ADC") of a data storage medium, at 404. The ADC may be based, at least in part, on BPI, tracks per inch ("TPI"), or both. The ADC may vary from DSD to DSD, model to model, and so forth.

The method 400 may recover extra storage capacity based on the ADC, at 406. In some cases, a DSD may exceed storage capacity specifications. For example, a DSD designed to store one terabyte may have in fact been manufactured with a storage capacity of 1.2 terabytes. The extra 200 gigabytes may be used to increase reliability.

The method 400 may determine format set parameters, at 408. The format set parameters can include gap parameters, headers, error correction code, and so forth. The format set parameters may vary by region. A DSD may adjust the format set parameters to fine tune capacity and reliability characteristics. Accordingly, the method 400 may include setting the capacity based on format set parameters and ADC, at 410. FIGS. 5, 6, 7, and 8 present embodiments which may implement the "determine format set parameters" operation of 408 and the "set capacity" operation of 410.

Figure 5:
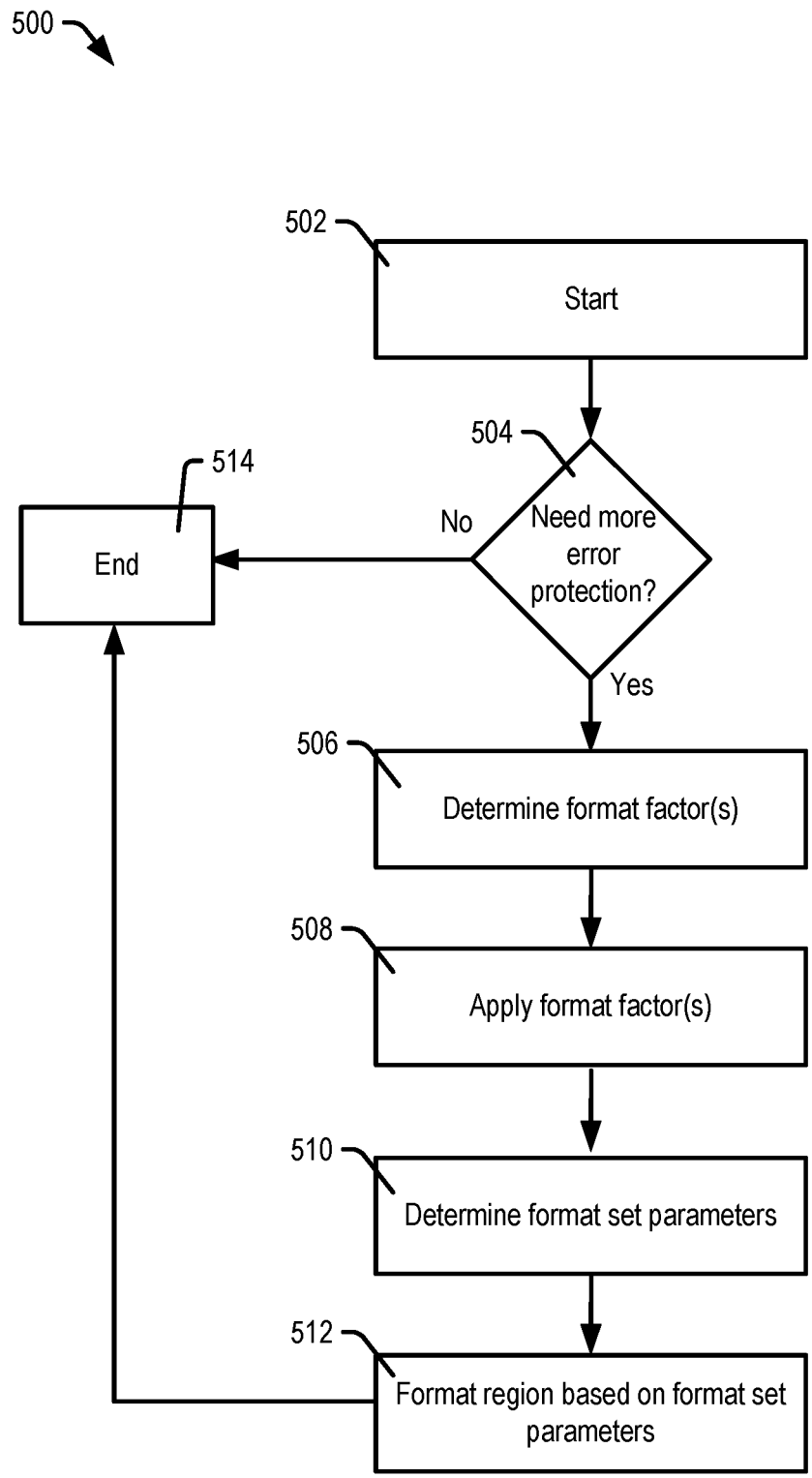
FIG. 5 is a flowchart of a method for On the Fly Formatting, in accordance with certain embodiments of the present disclosure.

Referring to FIG. 5, a flowchart of a method for on the fly formatting is shown and generally designated 500. The method 500 is an implementation of systems 100, 200, 300, or 400, in accordance with certain embodiments. In some cases, the method 500 may be the format determination and capacity setting operations of method 400.

The method 500 starts, at 502. In some cases, method 500 can include determining if more reliability is needed, at 504. When more reliability is needed, the method 500 can include determining format factors, at 506. Format factors can include BPI and other parameters. The format factors may be implemented, at 508.

Referring to FIG. 5, a flowchart of a method for on the fly formatting is shown and generally designated 500. The method 500 is an implementation of systems 100, 200, 300, or 400, in accordance with certain embodiments. In some cases, the method 500 may be the format return operation 408.

The method 500 start, at 502. In some cases, method 500 can start include determining if more reliability is needed, at 504. When more reliability is needed, the method 500 can include determining format factors, at 506. Format factors can include BPI and other parameters. The format factors may be implemented, at 508.

Figure 6:
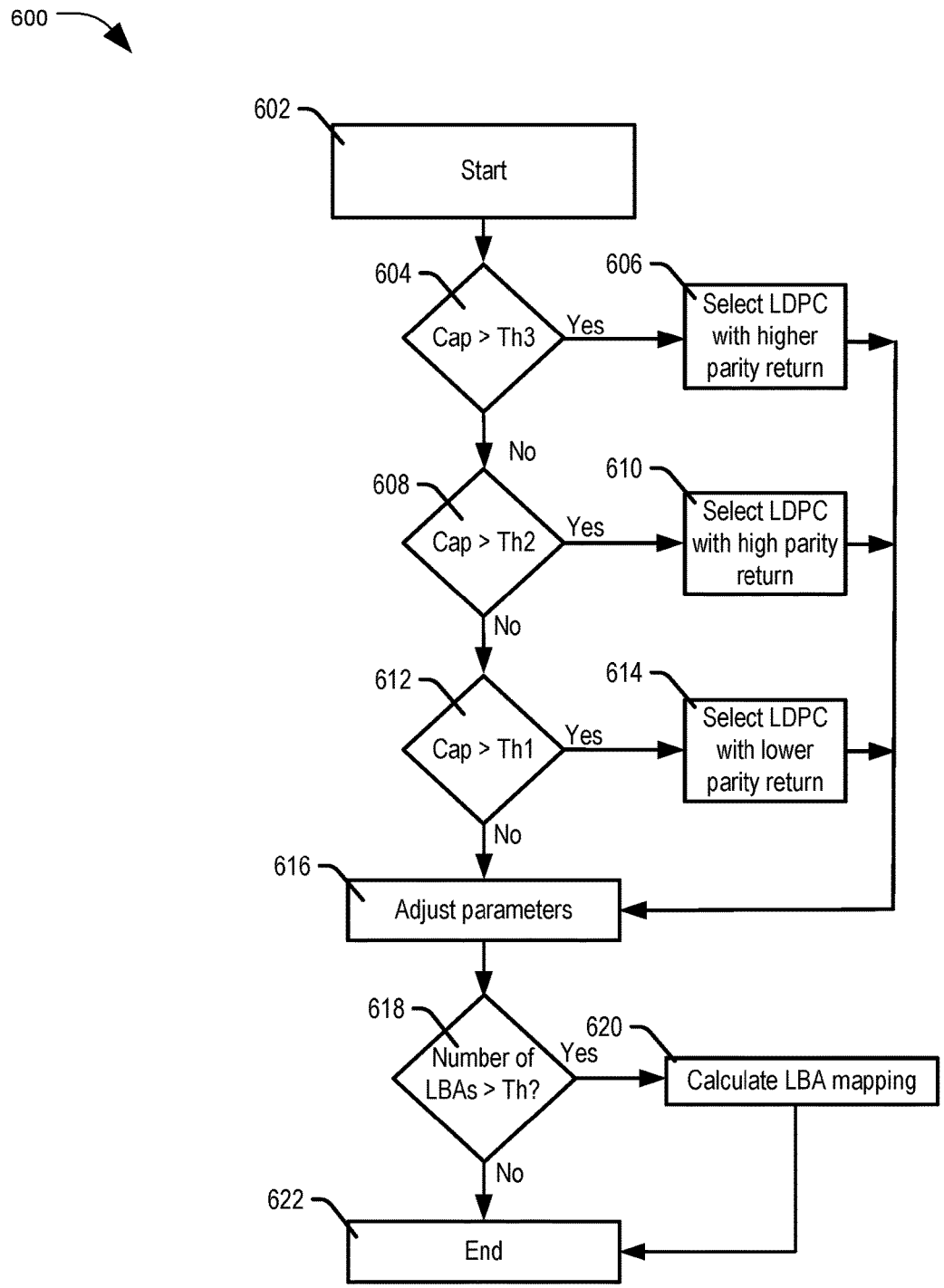
FIG. 6 is a flowchart of a method for On the Fly Formatting, in accordance with certain embodiments of the present disclosure.

The method 500 may determine format set parameters, at 510 (see FIG. 6 for details). In some cases, the format set parameters may include error correction code strength, gap settings, or other factors. When the format set parameters are determined, the method 500 can format one or more regions based on the format set parameters, at 512. The method 500 can end, at 514.

Referring to FIG. 6, a flowchart of a method for on the fly formatting is shown and generally designated 600. The method 600 is an implementation of systems 100, 200, 300, 400, or 500, in accordance with certain embodiments. In some cases, the method 600 may be the "determine format set parameters operation" 510 shown in FIG. 5.

Extra storage capacity may be recovered to increase reliability. In some embodiments, the amount of extra storage capacity can be compared with ECC codes of different correction strength to determine an optimized ECC for an available space based on the extra storage capacity. The ECC having the highest correction strength (and thus requiring more storage resources) that does not exceed a threshold amount of the available extra storage capacity may be implemented in a corresponding region.

In some embodiments, there may be multiple extra storage capacity thresholds for determining an ECC that can maximize a level of error correction for an available storage space. For example, a system may have three available extra storage capacity thresholds: high, medium, and low, each having a different corresponding optimal ECC based on available storage capacity.

The method 600 can start, at 602. The method 600 can determine if the available extra storage capacity is greater than the high threshold value, at 604. When the available extra storage capacity is greater than the high threshold value, the method 600 can include selecting an ECC with a high level of error protection, at 606, that requires a first amount of storage capacity. The method 600 may then adjust other format set parameters, at 616.

When the available extra storage capacity is less than the high threshold value, the method 600 can include determining if the available extra storage capacity is greater than the medium threshold value, at 608. When the available extra storage capacity is greater than a medium threshold but less than the high threshold, the method 600 can include selecting an ECC corresponding to a medium level of error protection, at 610, that requires a second amount of storage capacity less than the first amount of storage capacity for the high level of error protection. The method 600 may then adjust other parameters, at 616.

When the available extra storage capacity is not greater than the medium threshold, the method 600 can include determining if the available extra storage capacity is greater than the low threshold, at 612. When the available capacity is greater than the low threshold but less than the medium threshold value, the method 600 can include selecting an ECC with a lower level of error protection, at 614, that requires a third amount of storage capacity less than the second amount of storage capacity for the medium level of error protection. If the storage capacity is less than the lower threshold, the ECC may not be changed. The method 600 may then adjust other parameters, at 616 see FIG. 7 for details). The number of thresholds and selectable ECC variations can be less or more than the example provided that shows three. In some embodiments, the selectable ECC is a selectable LDPC.

In some examples, the number of thresholds and values of the thresholds may vary. In some cases the threshold values and the number of thresholds may vary for each DSD, by product model, and so forth. In some cases, the threshold values may be based, at least in part, on circuit functions (SOC, ASIC, etc.), circuit designs (e.g. channel circuit designs), firmware code, other factors, or any combination thereof. In some embodiments, other methods may be used to determine the format set parameters. For example, iterative calculations based on a gap parameter, header, or other parameter may be used to determine the format set parameters.

The method 600 can determine if a number of logical block addresses (LBAs) mapped to the region exceeds a threshold level, at 618. In some examples, a threshold level may be an available storage capacity of the region. In some cases, when reliability is increased, available storage capacity may be reduced. When the available storage capacity is too small to accommodate the mapped LBAs, the number of LBAs mapped to the region may be reduced. The method 600 can determine which LBAs may be remapped, and to what locations, at 620. In some embodiments, firmware or software executed by a processor or controller can determine a new LBA mapping.

The method 600 may end, at 622, which may then allow a region to be formatted or re-formatted based on the settings of the parameters.

In some embodiments, the method 600 may be independent of the method 500. The method 600 may include more or fewer operations. In some embodiments, the method 600 may select the others parameters before selecting the ECC.

Figure 7:
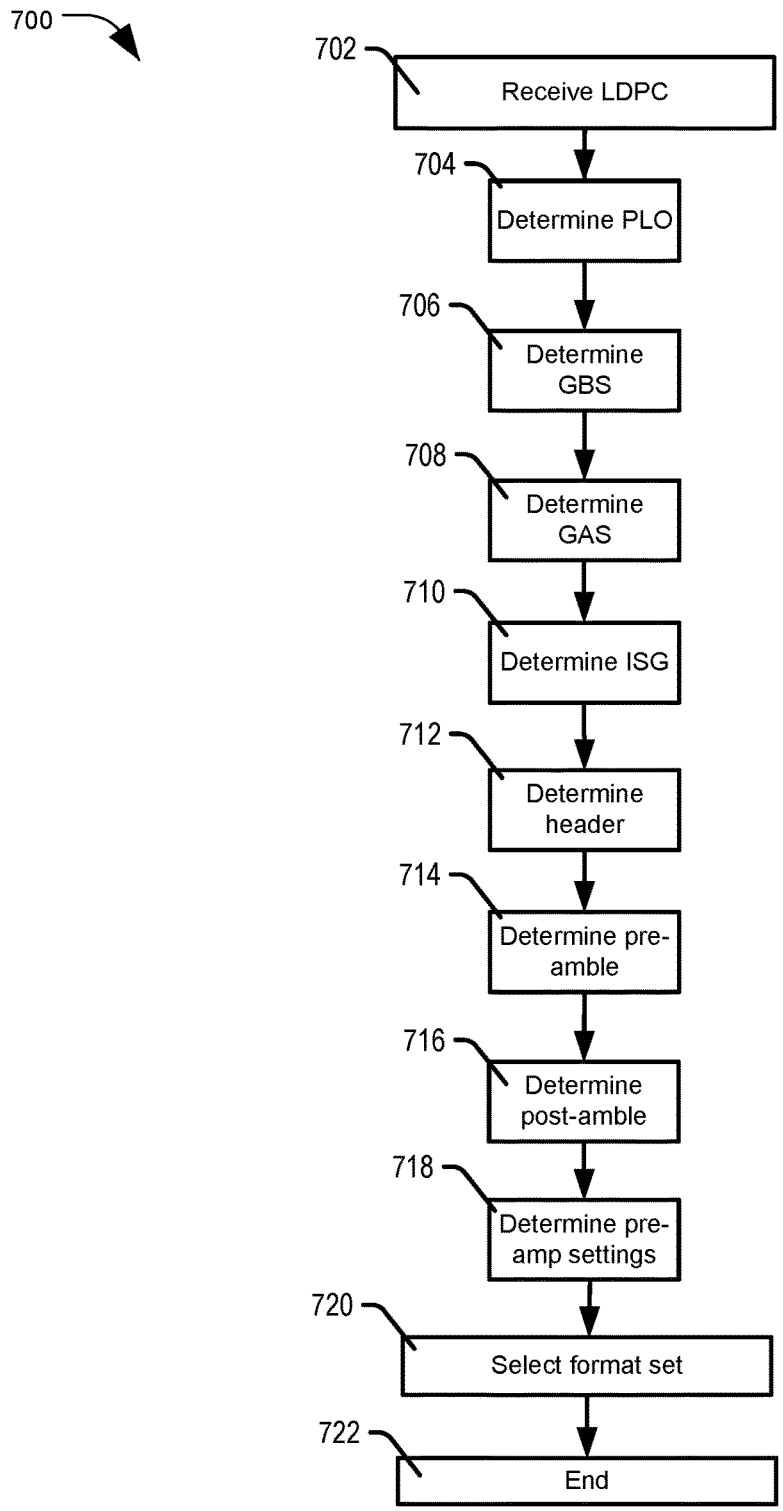
FIG. 7 is a flowchart of a method for On the Fly Formatting, in accordance with certain embodiments of the present disclosure.

Referring to FIG. 7, a flowchart of a method for on the fly formatting is shown and generally designated 700. The method 700 includes implementations of systems 100, 200, 300, 400, 500, or 600, in accordance with certain embodiments. In some cases, the method 600 may be an example of operation 616 of FIG. 6.

When new values for ECC are selected, values for ISG, GBS, GAS, or header may be calculated. In some cases, PLO (phase-locked oscillator jitter), pre-amble, post-amble, pre-amp settings or other settings can be calculated.

The method 700 can include determining a value for the PLO, at 704, GBS, at 706, GAS, at 708, and ISG, at 710. The method 700 can determine a value for the header, at 712, pre-amble, at 714, post-amble, 716, and pre-amp settings, at 718.

Once the parameter values have been determined, the method 700 can include selecting a format set based on the parameter values, at 720. In some embodiments, the method 700 can check to see if the selected format set is a good match, or if another format set may be selected. In some examples, format sets may be stored in a memory, such as a read-only memory. In some cases, format sets may be retrieved from locations outside of the DSD. For example, a DSD may download the format sets from a server via a network connection. The method 700 can end, at 722.

Some parameters may have a greater impact on a region's reliability and capacity than other parameters. For example, adjustments to the PLO may have a greater impact on the reliability and capacity than do adjustments to other parameters, such as the ISG, post-amble, or pre-amp delay. Therefore, it may be desirable to determine values for parameters having the highest impact. Also, a format set may be chosen based first on the parameters having the highest impact, and then on other parameters. The impact a parameter may have on reliability or capacity can vary, and parameter values can be determined in any order, irrespective of relative impact level.

In some examples, the method 700 may calculate format parameter values in parallel. The method 700 shown in FIG. 7 is one of various embodiments that are possible, as the order and inclusion of which parameters to adjust can be changed.

Figure 8:
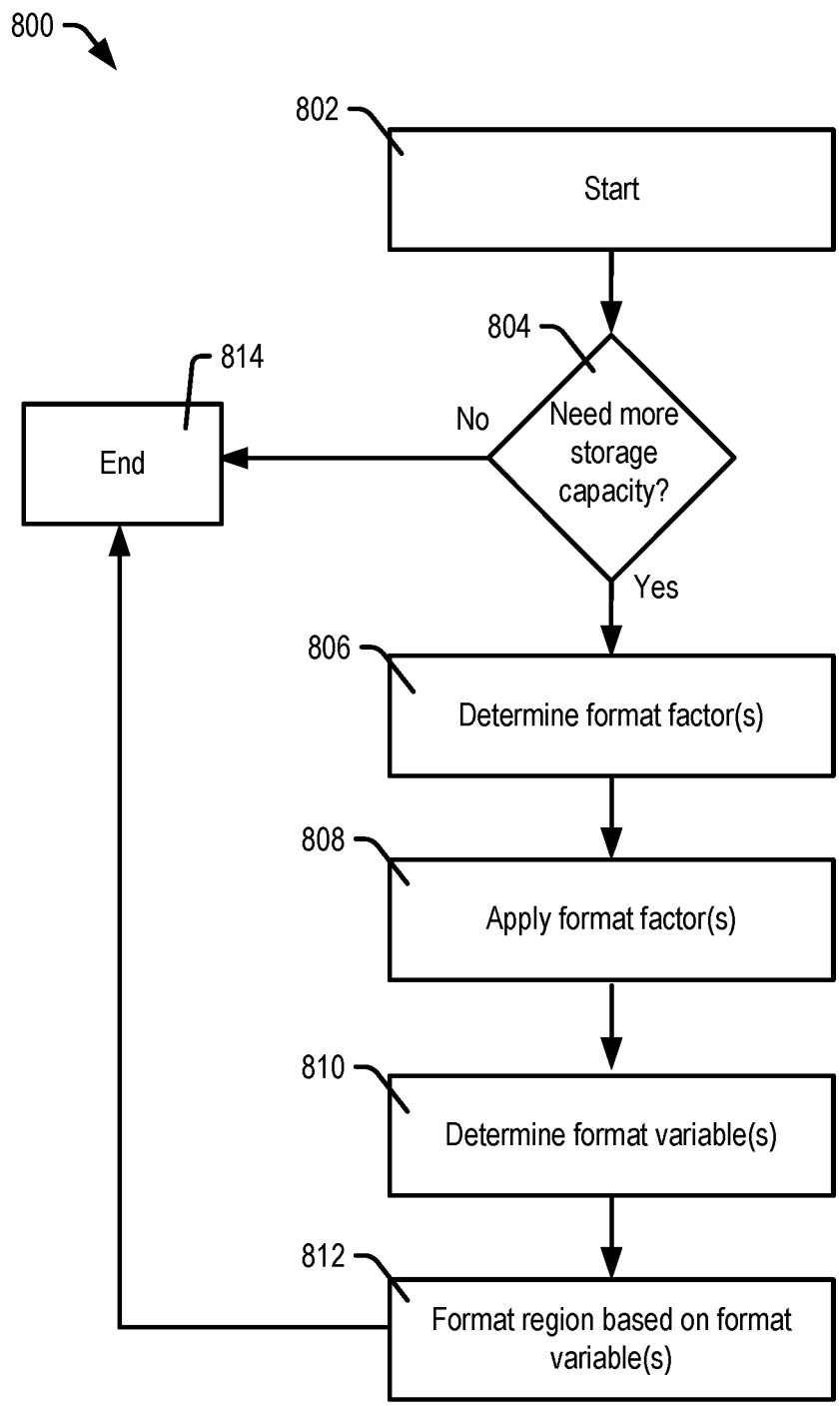
FIG. 8 is a flowchart of a method for On the Fly Formatting, in accordance with certain embodiments of the present disclosure.

Referring to FIG. 8, a flowchart of a method for on the fly formatting is shown and generally designated 800. The method 800 is an implementation of systems 100, 200, 300, or 400, in accordance with certain embodiments.

The method 800 can start at 802. In some embodiments, the method 800 may start during a manufacturing process, such as a burn-in process, and can include determining if more storage capacity is needed, at 804. When more storage capacity is needed, the method 800 can include determining format factors, at 806. In some examples, the format factors can include BPI values. The format factors may be adjusted to achieve a desired level of reliability, storage capacity, other parameter(s), or any combination thereof. For example, the storage capacity may be increased by increasing the BPI. The format factors may be applied, at 808. When no additional storage capacity is needed, the method 800 can end, at 814.

The method 800 may determine format set parameters, at 810. In some cases, the format set parameters may include error correction code strength, gap settings, or other factors. When the format set parameters are determined, the method 800 can format the one or more regions based on the format set parameters, at 812. The method 800 can end, at 814.

In some embodiments, additional operations may be added, some operations may be removed, or the order of operation may change. In some cases, an ATFG may be an application specific integrated circuit, a system on chip, or other circuit. An ATFG may be integrated with read/write channel circuit(s) or may be an independent circuit.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
a channel circuit configured to encode data during a write operation to a data storage medium and reconstruct user data during a read operation from the data storage medium;
the channel circuit configured to implement a first low density parity check code as an error correcting code; and
the channel circuit configured to implement a second low density parity check code based on a change to a density of a region of the data storage medium.

2. The apparatus of claim 1 further comprising a modification circuit configured to modify the density based on one or more characteristics of a data storage device including the apparatus.

3. The apparatus of claim 2 further comprising the one or more characteristics includes an available storage capacity of the region.

4. The apparatus of claim 1 further comprising:
the data storage medium having a servo sector; and
a control circuit configured to modify a gap between an end of the servo sector and a beginning of the region.

5. The apparatus of claim 4 further comprising:
the control circuit further configured to change a size of error correction code data associated with the region based on a modification of the gap.

6. The apparatus of claim 1 further comprising:
a control circuit configured to change a size of error correction code data associated with the region based on an amount of available storage capacity associated with the region.

7. A device comprising:
a control circuit configured to modify a format of a region of a data storage medium on the fly during operation of a data storage device controlling the data storage medium, including changing error correction code (ECC) data of the region from a first ECC scheme employing a first number of parity bits to a second ECC scheme employing a second number of parity bits different from the first number of parity bits.

8. The device of claim 7 further comprising the control circuit configured to change the size of the error correction code data in response to a determination of a reliability value associated with the region.

9. The device of claim 7 further comprising the control circuit configured to change the size of the error correction code data in response to a determination of a need for a change in data storage capacity.

10. The device of claim 7 further comprising:
a channel circuit configured to encode data during write operations to the data storage medium and reconstruct data during read operations from the data storage medium;
the channel circuit configured to implement a first low density parity check code as the first ECC scheme having a first size of data on the data storage medium;
the channel circuit configured to implement a second low density parity check code as the second ECC scheme having a second size of data on the data storage medium; and
the first size is different than the second size.

11. The device of claim 7 further comprising:
the data storage medium having a servo sector; and
the control circuit configured to modify a gap between an end of the servo sector and a beginning of the region.

12. The device of claim 11 further comprising:
the control circuit further configured to change the size of error correction code data associated with the region based on a modification of the gap.

13. A circuit comprising:
a controller configured to perform on-the-fly formatting of a data storage track including selectively changing a size of error correction data stored on the data storage track based on switching from implementing a first error correction code (ECC) using a first number of parity bits to implementing a second ECC using a second number of parity bits.

14. The circuit of claim 13 further comprising the controller configured to modify an areal density of a region of a magnetic data storage medium based on a reliability value, during operation of the data storage medium.

15. The circuit of claim 14 further comprising:
a memory including multiple format sets wherein each of the format sets includes a pre-determined combination of parameter values, and the parameter values include at least one of a first gap width between the region and an end of a servo sector, a second gap width between the region and a beginning of the servo sector, a third gap width between the region and another region, a low density parity check code, a header, a pre-amble, a post-amble, and phase-locked oscillator setting; and
the controller configured to selectively implement one of the multiple format sets based on the reliability value.

16. The circuit of claim 13 further comprising:
the controller further configured to determine if an available storage capacity is greater than a first threshold value, and implement the first ECC for the data storage track when the available storage capacity is greater than the threshold value, and implement the second ECC when the available storage capacity is less than the first threshold value.

17. The circuit of claim 16 further comprising:
the controller further configured to determine if the available storage capacity is greater than a second threshold value, and implement the second ECC when the available storage capacity is greater than the second threshold value.

18. The circuit of claim 13 further comprising:
the controller configured to change the size of the error correction data in response to a determination of a reliability value associated with the region.

19. The circuit of claim 13 further comprising:
the controller configured to change the size of the error correction data in response to a determination of a need for a change in data storage capacity.

20. The circuit of claim 13 further comprising:
a channel circuit configured to encode data during a write operation to the data storage track and reconstruct user data during a read operation from the data storage track;
the channel circuit configured to implement a first low density parity check code as the first ECC; and
the channel circuit configured to implement a second low density parity check code as the second ECC based on a change to a size of the error correction data.

* * * * *